United States Patent
Mun et al.

(10) Patent No.: US 12,289,913 B1
(45) Date of Patent: Apr. 29, 2025

(54) DEVICE WITH METAL FIELD PLATE EXTENSION

(71) Applicant: GlobalFoundries Singapore Pte. Ltd., Singapore (SG)

(72) Inventors: Bong Woong Mun, Singapore (SG); Khon Cho, Singapore (SG)

(73) Assignee: GLOBALFOUNDRIES Singapore Pte. Ltd, Singapore (SG)

( * ) Notice: Subject to any disclaimer, the term of this patent is extended or adjusted under 35 U.S.C. 154(b) by 0 days.

(21) Appl. No.: 18/642,052

(22) Filed: Apr. 22, 2024

(51) Int. Cl.
| | |
|---|---|
| *H10D 64/00* | (2025.01) |
| *H01L 23/522* | (2006.01) |
| *H01L 23/528* | (2006.01) |
| *H10D 30/01* | (2025.01) |
| *H10D 30/65* | (2025.01) |
| *H10D 62/10* | (2025.01) |

(52) U.S. Cl.
CPC ........ *H10D 64/111* (2025.01); *H01L 23/5226* (2013.01); *H01L 23/5283* (2013.01); *H10D 30/0281* (2025.01); *H10D 30/658* (2025.01); *H10D 62/115* (2025.01)

(58) Field of Classification Search
None
See application file for complete search history.

(56) References Cited

U.S. PATENT DOCUMENTS

| | | | |
|---|---|---|---|
| 7,368,785 B2* | 5/2008 | Chen ................. | H01L 29/66681 257/341 |
| 7,956,412 B2* | 6/2011 | Feilchenfeld ........ | H10D 64/117 257/305 |
| 9,099,434 B2 | 8/2015 | Zhang et al. | |
| 9,570,606 B2 | 2/2017 | Li | |
| 11,257,949 B2 | 2/2022 | Mun et al. | |
| 2013/0277741 A1 | 10/2013 | Guowei et al. | |
| 2014/0332884 A1* | 11/2014 | Zhang .................. | H01L 29/402 257/336 |
| 2015/0287780 A1* | 10/2015 | Zhang ................. | H01L 29/7843 257/339 |
| 2016/0111488 A1 | 4/2016 | Lu et al. | |
| 2016/0149030 A1 | 5/2016 | Kim et al. | |
| 2017/0104097 A1* | 4/2017 | Park ...................... | H01L 23/535 |
| 2019/0140071 A1* | 5/2019 | Mun ...................... | H10D 8/60 |
| 2019/0305129 A1 | 10/2019 | Uda | |

(Continued)

FOREIGN PATENT DOCUMENTS

CN 115020497 A * 9/2022 ......... H01L 29/0619

OTHER PUBLICATIONS

Yu et al ("Semiconductor device and preparation method thereof") (Year: 2022).*

(Continued)

*Primary Examiner* — Khaja Ahmad
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to devices with a metal field plate extension and methods of manufacture. The structure includes: a gate structure over a semiconductor substrate; a drift region under the gate structure; a source region adjacent to the gate structure; a drain region in the drift region; a isolation structure within the drift region; and a contact extending from the source region and into the isolation structure within the drift region.

19 Claims, 6 Drawing Sheets

(56) References Cited

U.S. PATENT DOCUMENTS

| | | | | |
|---|---|---|---|---|
| 2020/0395452 | A1* | 12/2020 | Wang | H10D 64/111 |
| 2021/0234041 | A1* | 7/2021 | Jin | H10D 62/116 |
| 2022/0181444 | A1* | 6/2022 | Toner | H01L 29/47 |
| 2023/0275149 | A1 | 8/2023 | Wu et al. | |
| 2024/0030341 | A1 | 1/2024 | Pandey et al. | |

OTHER PUBLICATIONS

M. Jagadesh Kumar et al., "Extended-p+ Stepped Gate LDMOS for Improved Performance," in IEEE Transactions on Electron Devices, vol. 57, No. 7, pp. 1719-1724, Jul. 2010, doi: 10.1109/TED.2010.2049209, Abstract, 4 pages.

Yuanzheng Zhu et al., "Folded Gate LDMOS Transistor With Low On-Resistance and High Transconductance", in IEEE Transactions on Electron Devices, vol. 48, No. 12, pp. 2917-2928, Dec. 2001, 12 pages.

Jin Wei et al., "High-Speed Power MOSFET with Low Reverse Transfer Capacitance Using a Trench/Planar Gate Architecture", 2017 29th International Symposium on Power Semiconductor Devices and IC's (ISPSD), Sapporo, Japan, 2017, pp. 331-334, doi: 10.23919/ISPSD.2017.7988956, 4 pages.

Tobias Erlbacher et al., "Reduced On Resistance in LDMOS Devices by Integrating Trench Gates Into Planar Technology", in IEEE Electron Device Letters, vol. 31, No. 5, pp. 464-466, May 2010, doi: 10.1109/LED.2010.2043049, 3 pages.

R. Gay et al., "A Novel Trench-Based Triple Gate Transistor With Enhanced Driving Capability", in IEEE Electron Device Letters, vol. 42, No. 6, pp. 832-834, Jun. 2021, doi: 10.1109/LED.2021.3076609, 3 pages.

Non-Final Rejection Office Action dated Oct. 30, 2024 in U.S. Appl. No. 18/649,301, 18 pages.

Non-Final Rejection Office Action dated Sep. 25, 2024 in U.S. Appl. No. 18/642,052, 16 pages.

Response to Restriction Requirement dated Aug. 30, 2024 in U.S. Appl. No. 18/642,052, 1 page.

Response to Non-Final Rejection dated Jan. 30, 2025 in U.S. Appl. No. 18/649,301 11 pages.

\* cited by examiner

DEVICE WITH METAL FIELD PLATE EXTENSION

BACKGROUND

The present disclosure relates to semiconductor structures and, more particularly, to devices with a metal field plate extension and methods of manufacture.

A laterally-diffused metal-oxide semiconductor (LD-MOS) is a planar double-diffused MOSFET (metal-oxide-semiconductor field-effect transistor) used in amplifiers, including microwave power amplifiers, RF power amplifiers and audio power amplifiers. The fabrication of LDMOS devices mostly involves various ion-implantation and subsequent annealing cycles. As an example, the drift region of a power MOSFET is fabricated using up to three ion implantation sequences in order to achieve the appropriate doping profile needed to withstand high electric fields.

A silicon-based RF LDMOS (radio-frequency LDMOS) is a widely used RF power amplifier in mobile networks, enabling the majority of the world's cellular voice and data traffic. LDMOS devices are widely used in RF power amplifiers for base-stations as the requirement is for high output power with a corresponding drain to source breakdown voltage. Compared to other devices such as GaAs FETs, RF LDMOS shows a lower maximum power gain frequency.

SUMMARY

In an aspect of the disclosure, a structure comprises: a gate structure over a semiconductor substrate; a drift region under the gate structure; a source region adjacent to the gate structure; a drain region in the drift region; an isolation structure within the drift region; and a contact extending from the source region and into the isolation structure within the drift region.

In an aspect of the disclosure, a structure comprises: a semiconductor substrate; a drift region in the semiconductor substrate; a gate structure at least partly overlapping with the drift region; an isolation structure within the drift region and adjacent to the gate structure; a source region and a drain region adjacent to the gate structure; and a contact electrically connected to the source region, extending over the gate structure and extending to within the isolation structure within the drift region.

In an aspect of the disclosure, a method comprises: forming a gate structure over a semiconductor substrate; forming a drift region under the gate structure; forming a source region adjacent to the gate structure; forming a drain region in the drift region; forming an isolation structure within the drift region; and forming a contact extending from the source region and into the isolation structure within the drift region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to devices with a metal field plate extension and methods of manufacture. More specifically, the present disclosure relates to laterally diffused metal oxide semiconductors (LDMOS) with a metal field plate extension from a source side to a drain side of the device. In embodiments, the metal field plate extension on the drain side connects to contacts extending into an isolation structure. Advantageously, the metal field plate extension will deplete a drift region, reduce a surface electric field and increase breakdown voltage (BV).

In more specific embodiments, the LDMOS comprises a metal field plate extending over the drift region (from source side to the drain side). The metal field plate extension couples to one or more contacts extending in a shallow trench isolation structure or local oxidation in the drift region of the device. A liner (e.g., nitride or other etch stop layer) may be provided over the gate structure and under a gate dielectric material in the drift region.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
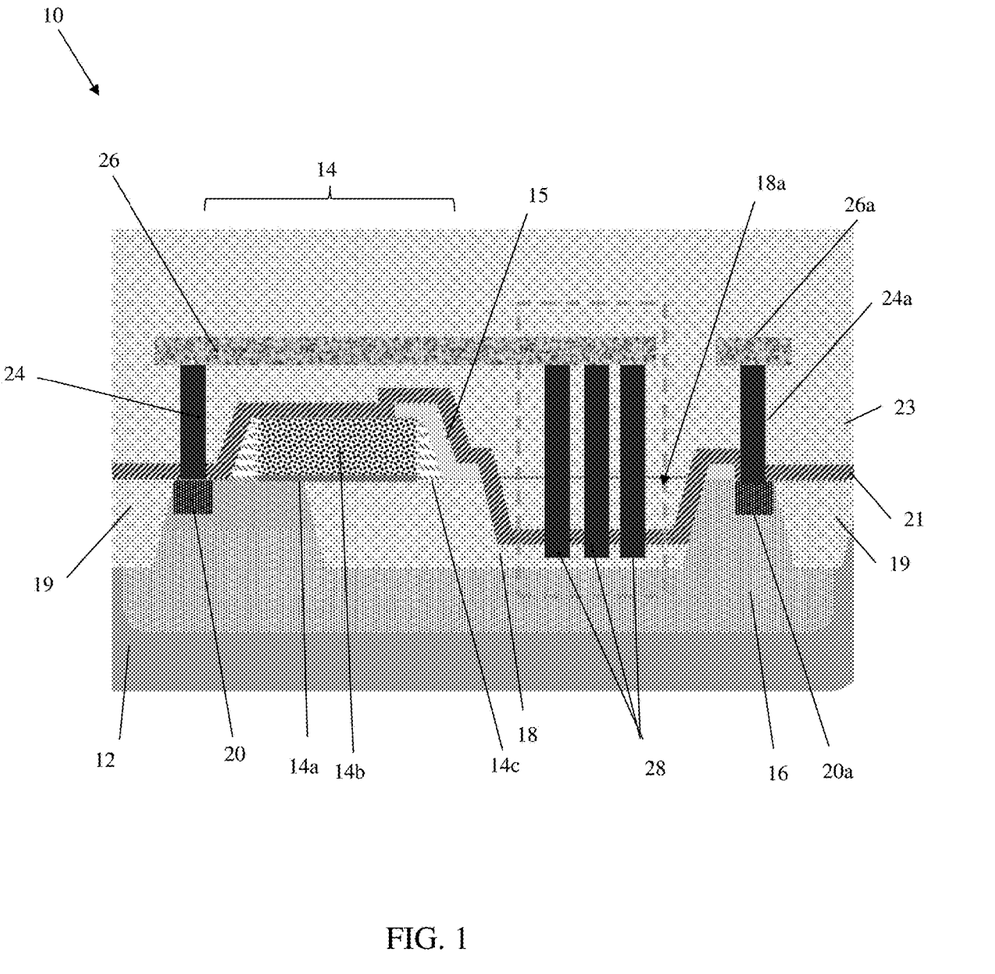
FIG. 1 shows a device and respective fabrication processes in accordance with aspects of the present disclosure.

FIG. 1 shows a device and respective fabrication processes in accordance with aspects of the present disclosure. More specifically, the device 10 includes a metal field plate extension 16 extending over a gate structure 14 and into a shallow trench isolation structure 18 within a drift region 16. The metal field plate extension 16 helps to deplete the drift region 16, to reduce surface electric field and increase breakdown voltage (BV).

More particularly, the device 10 of FIG. 1 includes a gate structure 14 over a semiconductor substrate 12. In embodiments, the gate structure 14 may be representative of an LDMOS. The semiconductor substrate 12 may be composed of any suitable bulk material including, but not limited to, Si, SiGe, SiGeC, SiC, GaAs, InAs, InP, and other III/V or II/VI compound semiconductors. Preferably, the semiconductor substrate 12 may comprise a p-type Si substrate comprising a single crystalline structure (or may be a p-well in a semiconductor substrate). The semiconductor substrate 12 may also be semiconductor-on-insulator (SOI) technology as is known in the art such that no further explanation is required for a complete understanding of the present disclosure.

In embodiments, the gate structure 14 may be provided over the drift region 16. For example, in embodiments, the drift region 16 may fully extend under the gate structure 14 (including under a source contact 24 and extending to a drain contact 24a). In alternative embodiments, the drift region 16 may partially extend under the gate structure 14 and extend to the drain contact 24a. The drift region 16 may be an n-well for an NMOS device or a p-well for a PMOS device, either of which is formed by an ion implantation process as further described in FIG. 6A. In embodiments, the source contact 24 and the drain contact 24a may be via interconnect structures.

A shallow trench isolation structure 18 may be formed partially under the gate structure 14 and within the drift region 16. In embodiments, a trench 18a may be formed within the shallow trench isolation structure 18, adjacent to the gate structure 14. The trench 18a may partially extend within the shallow trench isolation structure 18. The trench 18a may be lined with an insulator material 21 and filled with additional insulator material 23. The insulator material 21 may be a nitride material or other etch stop material and the insulator material 23 may be an interlevel dielectric material. The interlevel dielectric material 23 may be, for example, oxide, nitride or combinations of thereof, deposited by a conventional deposition method such as chemical vapor deposition (CVD).

Additional shallow trench isolation structures 19 may be formed at a junction of the drift region 16 and the semiconductor substrate 12. The shallow trench isolation structures 18, 19 can be formed by conventional lithography, etching and deposition methods known to those of skill in the art as also described in FIG. 6A.

The gate structure 14 may be fabricated using deposition, lithography and etching processes as is known in the art. For example, the gate structure 14 may be formed by a gate first process or a gate last process as described in more detail with respect to FIG. 6A.

The gate structure 14 may include gate dielectric material 14a and a gate electrode 14b. The gate dielectric material 14a may be a low-k dielectric material, e.g., $SiO_2$, or a high-k dielectric material. In embodiments, the high-k dielectric gate material may be, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate electrode 14b may be metal material or polysilicon material. The metal material may be any known workfunction materials, e.g., Ti, TiAlC, Al, TiAl, TaN, TiN, TIC, HfTi, TiSi, TaSi, TaC and/or Co.

Sidewall spacers 14c may be formed on the gate structure 14 by deposition of insulator material, e.g., oxide and/or nitride, followed by an anisotropic etching process as is known in the art. An oxide or other insulator material 15 may be partially formed over the gate structure 14, e.g., over a sidewall spacer 14c and gate electrode 14b. The oxide or other insulator material 15 may also extend partially onto the shallow trench isolation structure 18 adjacent to the gate structure 14.

The insulator material 21, e.g., etch stop layer, may be formed over the insulator material 15 and the gate structure 14, including the sidewall spacers 14c and gate electrode 14b. The insulator material 21 may also extend over the semiconductor substrate 12 and, as already noted herein, may be provided as a liner on sidewalls and a bottom surface of the trench 18a of the shallow trench isolation structure 18. In embodiments, the insulator material 21 may preferably be different insulator material than the insulator material 15. For example, the insulator material 21 may be an etch stop layer, e.g., a nitride material. The insulator material 23 may be provided within the trench 18a and over the insulator material 21.

Still referring to FIG. 1, diffusion regions 20, 20a may be formed adjacent to the gate structure 14. In embodiments, the diffusion region 20 may be a source region and the diffusion region 20a may be a drain region. As further described herein, the diffusion regions 20, 20a may be formed by conventional ion implantation processes with a p-type dopant (e.g., Boron) or an n-type dopant (e.g., Arsenic), depending on the device characteristics. In more specific embodiments, the diffusion regions 20, 20a may comprise an opposite conductivity type compared to the conductivity type of the drift region 16 (e.g., p-well or n-well). The diffusion region 20 may be formed in a body contact region 22, for example, Boron Nitride (opposite conductivity type to the drift region 16), within the drift region 16. The diffusion 20a may be formed directly within the drift region 16 on the drain side of the device.

The diffusion regions 20, 20a may be respectively connected to a source contact (e.g., via interconnect structure) 24 and a drain contact (e.g., via interconnect structure) 24a. A wiring structure 26 (e.g., metal field plate extension) may be electrically connected to the source contact 24 and a wiring structure 26a may be electrically connected to the drain contact 24a. The source contact 24 and drain contact 24a may be on a same back end of the line wiring layer, e.g., CA level.

In embodiments, the wiring structures 26, 26a may comprise any metal material used for wiring layers in CMOS processes. For example, the metal material may be copper, tungsten, or aluminum; although other metal or metal alloys are also contemplated herein. The source contact 24 and drain contact 24a may also be composed of metal material used for wiring layers in CMOS processes. For example, the metal material may be TiN, TaN, tungsten, aluminum, etc.

The wiring structure (e.g., metal field plate extension) 26 extends over the drift region 16, above the gate structure 14 and the trench 18a. The wiring structure 26 may be electrically connected to one or more contacts (e.g., via interconnect structures) 28 extending into the shallow trench isolation structure 18. In more specific embodiments, the wiring structure 26 extends from the source region to the drain region, e.g., over the drift region 16 and the one or more contacts 28 extend below the insulator material 21 lining the trench 18a. The depth and width of the one or more contacts 28 may be adjusted to optimize device performance. And as should already be understood by those of skill in the art, the wiring structure 26, e.g., metal field plate extension, and contacts 28 help to deplete the drift region 16, to reduce surface electric field and increase breakdown voltage (BV).

In operation, the wiring structure 26, e.g., metal field plate extension, and contacts 28 may attract electrons close to the interface of the shallow trench isolation structure 18 and the diffusion region 20a. Due to this attraction of electrons within the shallow trench isolation structure 18, for example, applying a positive bias to the gate structure 14 will reduce resistance in the drift region which, in turn, improves transconductance (gm), Ron and breakdown voltage, and reduces leakage.

Figure 2:
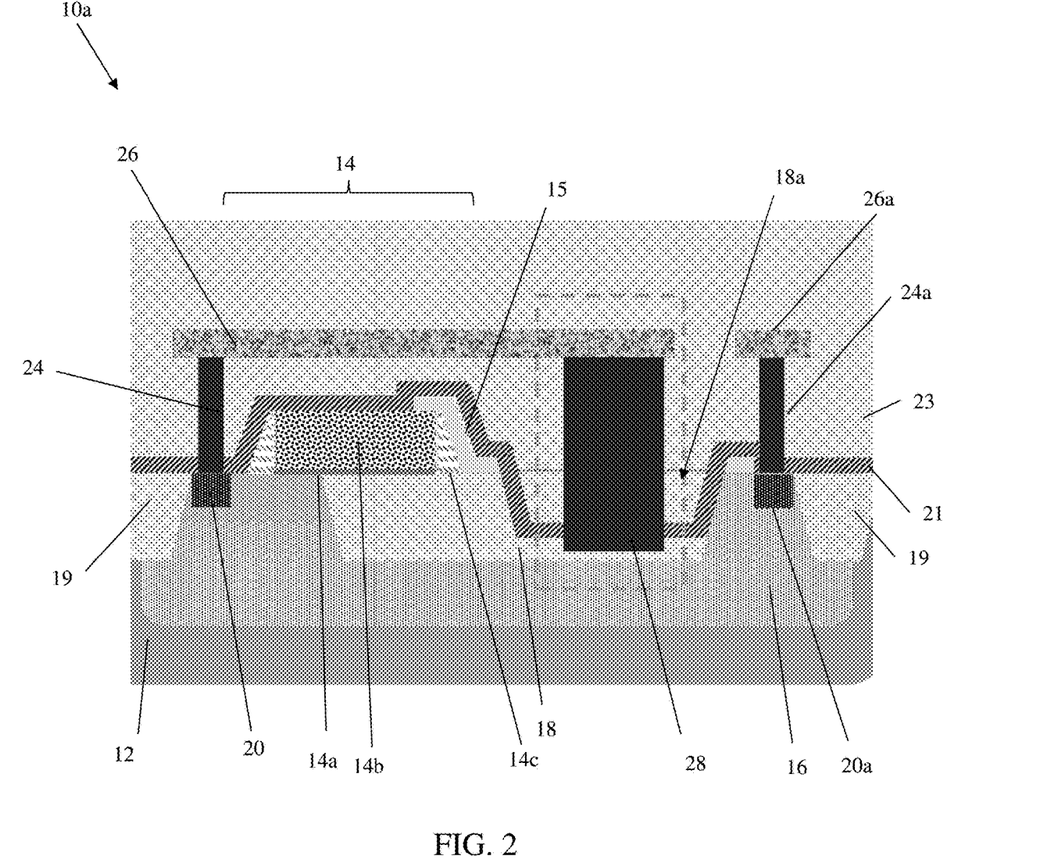
FIGS. 2-5 show devices and respective fabrication processes in accordance with additional aspects of the present disclosure.

FIGS. 2-5 show devices and respective fabrication processes in accordance with additional aspects of the present disclosure. For example, the device 10a in FIG. 2 shows a single contact 28 extending into the shallow trench isolation structure 18, below the insulator material 21 lining the trench 18a. As in the device 10 of FIG. 1, the single contact 28 connects to the wiring structure 26 extending from the source region to the drain region. The width of the contact 28 may be larger than any of the contacts shown in FIG. 1, as it may be adjusted to optimize device performance. The remaining features of the device 10a of FIG. 2 are similar to the features of the device 10 of FIG. 1.

Figure 3:
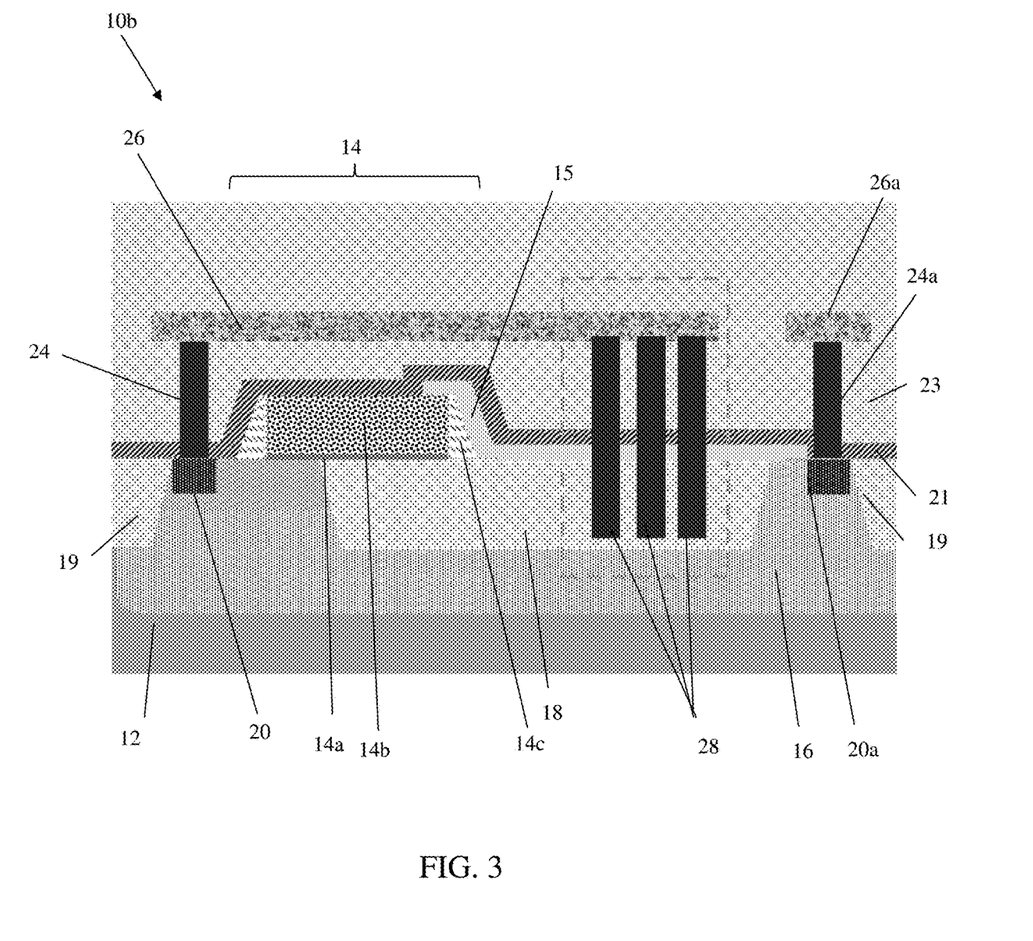

In FIG. 3, the device 10b does not include a trench in the shallow trench isolation structure 18. In the device 10b, the plurality of contacts 28 extend into the shallow trench isolation structure 18, below the insulator material 21 and insulator material 15. In this embodiment, the insulator material 15 may remain under the insulator material 21 which is above the shallow trench isolation structure 18. As in the device 10 of FIG. 1, the contacts 28 connect to the wiring structure 26 extending from the source region to the drain region. The depth of the contacts 28 may be adjusted to different depths in the shallow trench isolation structure 18. Also, the present disclosure contemplates that the plurality of contacts 28 may be a single contact as shown in FIG. 2. The remaining features of the device 10b of FIG. 3 are similar to the features of the device 10 of FIG. 1.

Figure 4:
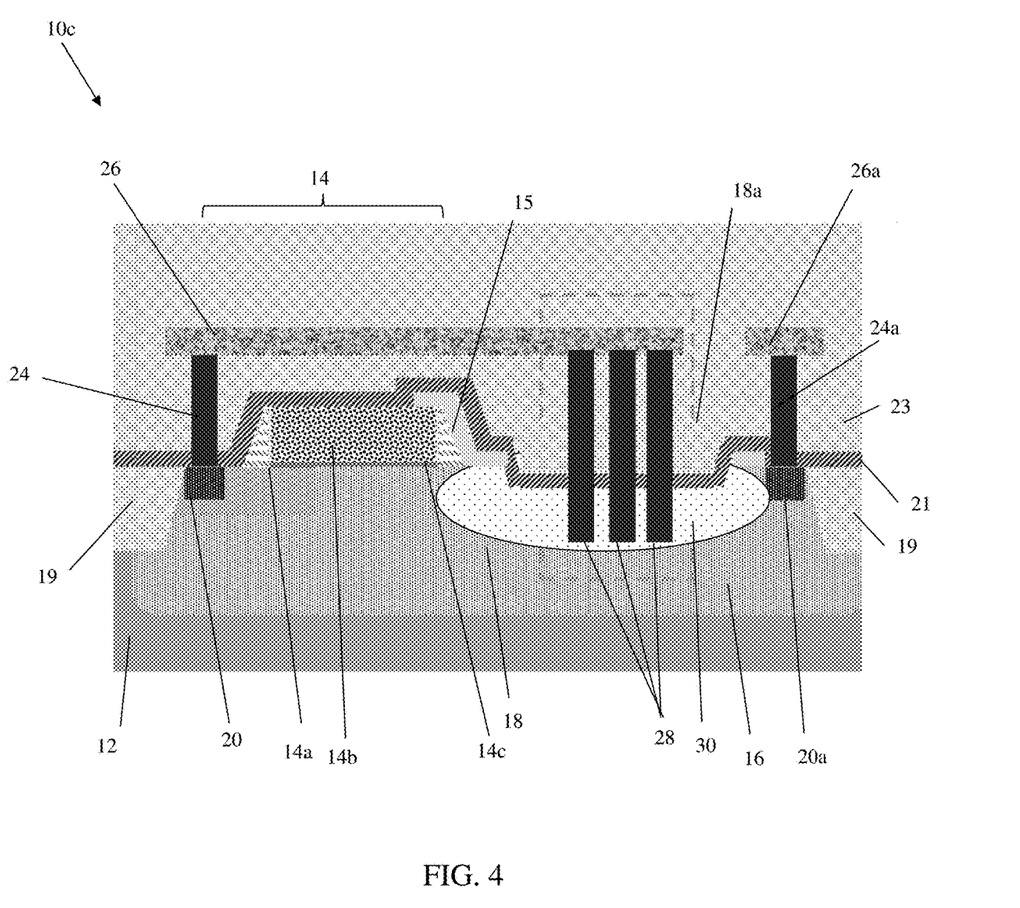

In FIG. 4, the device 10c includes a local oxidation 30 adjacent to the gate structure 14. In embodiments, the local oxidation 30 may be over a trench 18a formed in the semiconductor substrate 12. In the device 10c, the plurality of contacts 28 extend into the local oxidation 30, below the insulator material 21. As in the device 10 of FIG. 1, the contacts 28 connect to the wiring structure 26 extending from the source region to over the drift region 16. The depth of the contacts 28 may be adjusted to different depths in the local oxidation 30. Also, the present disclosure contemplates that the plurality of contacts 28 may be a single contact as shown in FIG. 2 or provided at different depths within the local oxidation 30. The remaining features of the device 10c of FIG. 4 are similar to the features of the device 10 of FIG. 1.

In embodiments, the local oxidation 30 may be the thermally grown oxide, e.g., LOCOS, extending within the drift region 16. As should be understood by those of skill in the art, LOCOS is a local oxidation of semiconductor material, e.g., Si. In the fabrication process, for example, $SiO_2$ is formed in selected areas on a semiconductor wafer having, for example, the Si—$SiO_2$ interface at a lower point than the rest of the silicon surface. In the thermal oxidation process, a thin layer of oxide (usually silicon dioxide) is provided on the surface of the semiconductor substrate. The process forces an oxidizing agent to diffuse into the semiconductor substrate at high temperature thus causing a reaction. Thermal oxidation may be applied to different materials, but most commonly involves the oxidation of silicon substrates to produce silicon dioxide.

Figure 5:
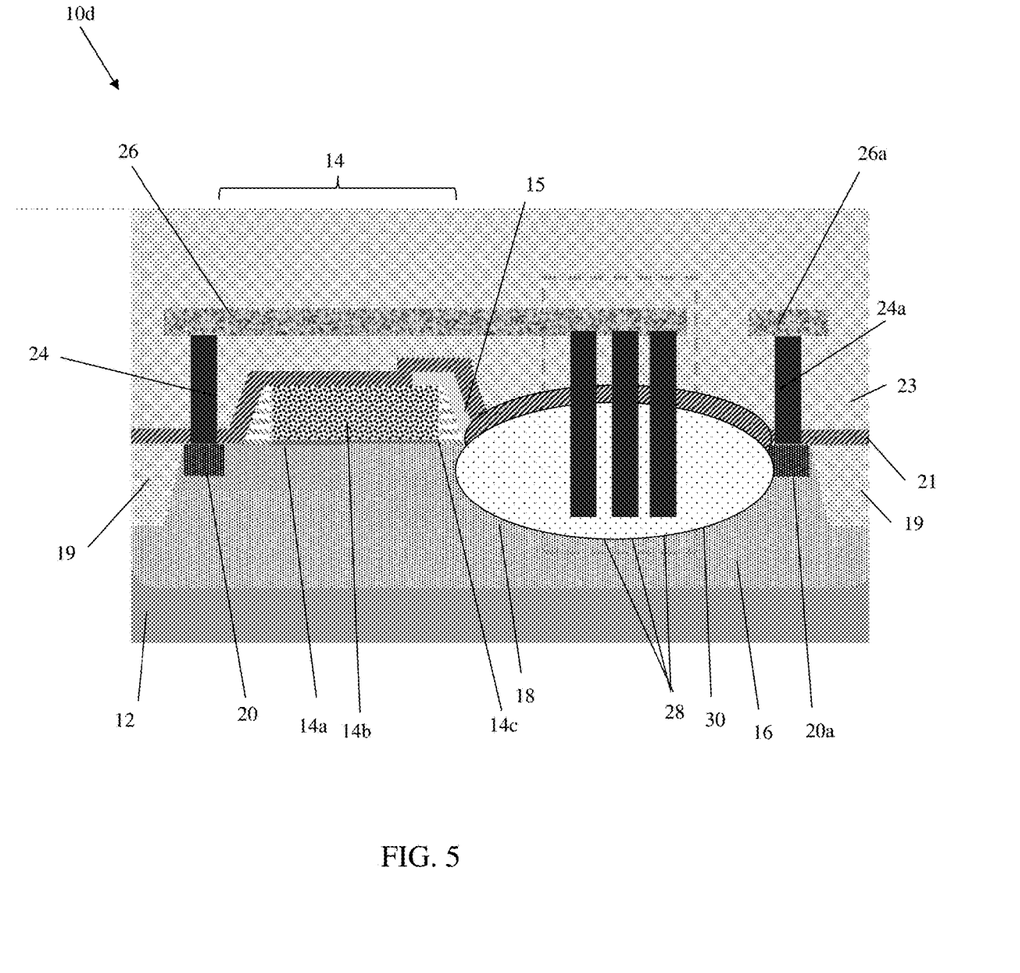

FIG. 5 shows a device 10d similar to the device 10c in FIG. 4. In this embodiment, the device 10d does not include a trench in the region of the local oxidation 30. In the device 10d, the plurality of contacts 28 also extend into the local oxidation 30, below the insulator material 21. As in the device 10c of FIG. 4, the contacts 28 connect to the wiring structure 26 extending from the source region and over the drift region 16. The depth of the contacts 28 may be adjusted to different depths in the local oxidation 30. Also, the present disclosure contemplates that the plurality of contacts 28 may be a single contact as shown in FIG. 2. The remaining features of the device 10d of FIG. 5 are similar to the features of the device 10c of FIG. 4.

Figure 6A:
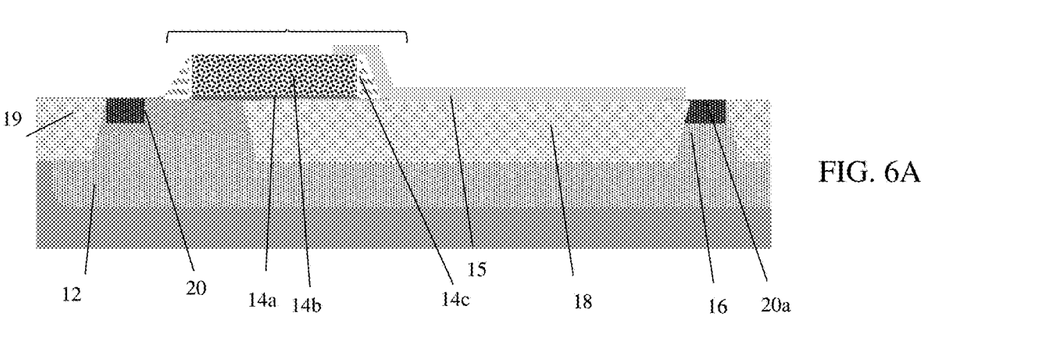
FIGS. 6A-6C show fabrication processes for manufacturing the device shown in FIG. 1 in accordance with aspects of the present disclosure.
Figure 6B:
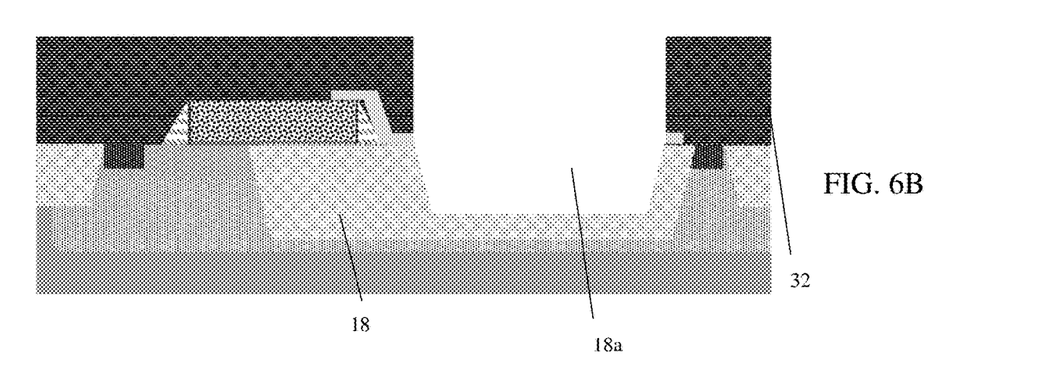
Figure 6C:
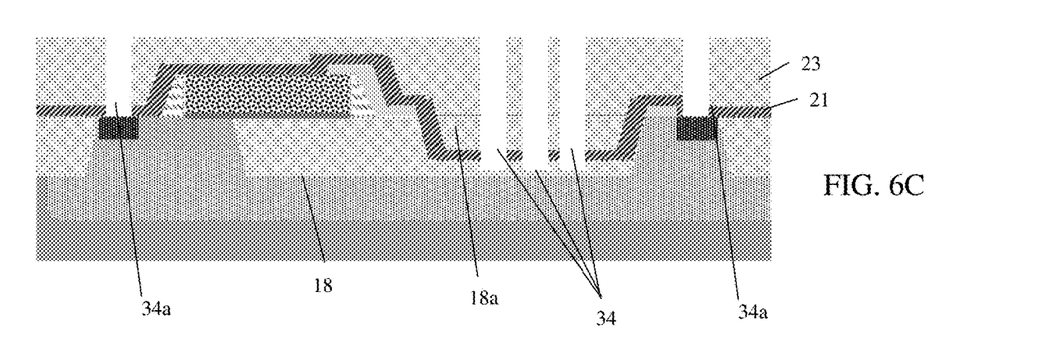

FIGS. 6A-6C show fabrication processes for manufacturing the device 10 of FIG. 1. It should be recognized that the processing steps shown in FIGS. 6A-6C may also be used to fabricate the devices shown in FIGS. 2-5.

As shown in FIG. 6A, the shallow trench isolation structures 18, 19 can be formed in the semiconductor substrate 12 by using conventional lithography, etching and deposition methods. For example, a resist formed over the semiconductor substrate 12 is exposed to energy (light) and developed utilizing a conventional resist developer to form a pattern (opening). An etching process with a selective chemistry, e.g., reactive ion etching (RIE), will be used to transfer the pattern from the resist to the semiconductor substrate 12 to form a trench in the semiconductor substrate 12. Following the resist removal by a conventional oxygen ashing process or other known stripants, insulator material (e.g., $SiO_2$) can be deposited by any conventional deposition processes, e.g., chemical vapor deposition (CVD) processes.

The diffusion regions 20, 20a and the drift region 16 may be formed by a conventional ion implantation process that introduces a concentration of different dopant into the semiconductor substrate 12. In embodiments, respective patterned implantation masks may be used to define selected areas exposed for the implantations. The implantation mask used to select the exposed area for forming the drift region 16 may be stripped after implantation, and before deposition of the implantation mask used to form the diffusion regions 20, 20a. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The n-type dopants may be, e.g., Arsenic (As), Phosphorus (P) and Sb, among other suitable examples. The p-type dopants may be, e.g., Boron (B).

The gate structure 14 may be formed by conventional deposition and patterning processes. For example, the gate dielectric material 14a may be deposited by conventional atomic layer deposition (ALD) processes or plasma enhanced CVD (PECVD) processes; whereas the gate electrode 14c may be deposited by a CVD process. Following the deposition processes, the materials 14a, 14b may be patterned using conventional lithography and etching processes, with the gate structure 14 extending partially over the shallow trench isolation structure 18 and over the drift region 16. Sidewall spacers 14c may be formed on the gate structure 14 by a deposition of insulator material, e.g., oxide and/or nitride, followed by an anisotropic etching process as is known in the art. In embodiments, the diffusion regions 20, 20a may be formed after the gate structure 14.

The insulator material 15 may be formed, e.g., deposited, over the gate structure 14, shallow trench isolation structure 18 and remaining semiconductor substrate 12. The insulator material 15 may be patterned using conventional lithography and etching processes as described herein.

In FIG. 6B, the trench 18a is formed in the shallow trench isolation structure 18. The trench 18a may be formed by conventional lithography and etching processes as described herein, with use of a resist material(s) 32. The etching process will also pattern the insulator material 15 over the shallow trench isolation structure 18. The trench 18a should not extend beyond a bottom of the shallow trench isolation structure 18.

In FIG. 6C, the insulator material 21 is deposited over the gate structure 14, in the trench 18a and over remaining portions of the shallow trench isolation structure 18, in addition to over the shallow trench isolation structures 19 and exposed portions of the semiconductor substrate 12, e.g., over the diffusion regions 20, 20a. The insulator material 21 may be nitride material or other etch stop material deposited by a CVD process, for example. The interlevel dielectric material 23 is deposited within the trench 18a and over the insulator material 21, e.g., over the gate structure 14, diffusion regions 20, 20a, etc. In embodiments, the interlevel dielectric material 23 may be alternating layers of $SiO_2$ and nitride, deposited by a conventional deposition method, e.g., CVD.

Contact holes 34, 34a may be etched into the interlevel dielectric material 23. In embodiments, the contact holes 34a may be etched to expose the diffusion regions 20, 20a. The contact holes 34 may also be etched within the trench 18a, through the insulator material 21 lining the trench 18a. The contacts holes may also expose the gate electrode 14b. In embodiments, the etching process may include, e.g., (i) a pre-etch with a deep hole for the contact hole 34 in the trench 18a, and then patterning the contact holes 34a, with the contact hole 34 being etched into the shallow trench isolation structure 18. In embodiments, two separate RIE steps may be used (e.g., one for the deeper holes 34 and the other etch for the contact holes 34a).

As should be understood by those of skill in the art, prior to the deposition of the metal material to form the contacts 24, 24a, 28, a silicide contact may be provided on the polysilicon material of the gate structure 14 and the diffusion regions 20, 20a. The silicide process begins with deposition of a thin transition metal layer, e.g., nickel, cobalt or titanium, over fully formed and patterned semiconductor devices (e.g., doped or ion implanted source region 20 and drain region 20a and respective device 14). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts would not be required on the devices when the gate structure is composed of a metal material.

Referring back to FIG. 1, the contacts 24, 24a, 28 are formed by depositing metal material within the contact holes 34, 34a. The metal material may be, for example, aluminum, copper, tungsten or other back end of the line conductive material. The metal material may be deposited by a conventional deposition process, e.g., CVD, followed by a planarization process to remove any excess material on a surface of the interlevel dielectric material. In embodiments, the planarization process may be a chemical mechanical polishing (CMP) process. The wiring structures 26 may be formed to the source contacts 24 and contacts 28, and the wiring structure 26a may be formed connected to the drain contact 24a.

The wiring structures 26, 26a may be formed by depositing additional layer(s) of interlevel dielectric material on the interlevel dielectric material, followed by a patterning process to form trenches exposing the contacts 24, 24a, 28. A metal material may be deposited within the trenches, followed by a CMP process. In embodiments, the additional layer(s) of interlevel dielectric material and the metal material may be deposited by conventional CVD processes. The additional layer(s) of interlevel dielectric material may be $SiO_2$ and/or nitride and the metal material may be similar or the same as the metal material as already described herein.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a gate structure over a semiconductor substrate;
    a drift region under the gate structure;
    a source region adjacent to the gate structure;
    a drain region in the drift region;
    an isolation structure within the drift region;
    an insulator layer lining the isolation structure;
    interlevel dielectric material over the insulator layer; and
    a contact extending from the source region and into the isolation structure within the drift region,
    wherein the contact comprises a first via interconnect structure electrically connecting to the source region, a metal field plate extension electrically connecting to the first via interconnect structure and extending partly over the drift region, and a second via interconnect structure electrically connecting to the metal field plate extension, wherein the second via interconnect structure extends into the isolation structure below the insulator layer.

2. The structure of claim 1, wherein the gate structure partially extends over the isolation structure.

3. The structure of claim 1, wherein the contact comprises a metal field plate extension over the drift region and the isolation structure.

4. The structure of claim 1, wherein the isolation structure comprises a shallow trench isolation structure, and further comprising an insulator layer over the shallow trench isolation structure.

5. The structure of claim 4, wherein the second via interconnect structure extends into the shallow trench isolation structure below the insulator layer.

6. The structure of claim 5, wherein the shallow trench isolation structure comprises a trench filled with the interlevel dielectric material and lined with the insulator layer, and the second via interconnect structure further extends into the trench and under the insulator layer.

7. The structure of claim 1, wherein the isolation structure comprises a local oxidation.

8. The structure of claim 7, further comprising a trench within the local oxidation.

9. The structure of claim 7, wherein the contact comprises a first via interconnect structure electrically connecting to the source region, a metal field plate extension electrically connecting to the first via interconnect structure and extending partly over the drift region, and a second via interconnect structure electrically connecting to the metal field plate extension, wherein the second via interconnect structure extends into the local thermal oxidation.

10. The structure of claim 1, wherein the contact comprises a first via interconnect structure electrically connecting to the source region, a metal field plate extension electrically connecting to the first via interconnect and a plurality of second via interconnect structures electrically connecting to the metal field plate extension and extending into the isolation structure.

11. The structure of claim 1, wherein the gate structure comprises a laterally diffused metal oxide semiconductor (LDMOS) device.

12. A structure comprising:
a semiconductor substrate;
a drift region in the semiconductor substrate;
a gate structure at least partly overlapping with the drift region;
an isolation structure within the drift region and adjacent to the gate structure;
a source region and a drain region adjacent to the gate structure;
a contact electrically connected to the source region, extending over the gate structure and extending to within the isolation structure within the drift region; and
a trench within the isolation structure, the trench being lined with an insulator material and filled with an interlevel dielectric material.

13. The structure of claim 12, wherein the contact comprises a via interconnect structure contacting the source region, a metal field plate extending over the gate structure and at least another via interconnect structure extending from the metal field plate and into the isolation structure.

14. The structure of claim 13, wherein the at least another via interconnect structure comprises a plurality of via interconnect structures.

15. The structure of claim 12, wherein the isolation structure comprises a shallow trench isolation structure.

16. The structure of claim 12, wherein at least another via interconnect structure extends into the trench and underneath the insulator material.

17. The structure of claim 15, wherein the shallow trench isolation structure extends at least partially under the gate structure.

18. The structure of claim 12, wherein the isolation structure comprises a local oxidation.

19. A method comprising:
forming a gate structure over a semiconductor substrate;
forming a drift region under the gate structure;
forming a source region adjacent to the gate structure;
forming a drain region in the drift region;
forming an isolation structure within the drift region;
forming a contact extending from the source region and into the isolation structure within the drift region; and
forming a trench within the isolation structure, the trench being lined with an insulator material and filled with an interlevel dielectric material.

\* \* \* \* \*